United States Patent
Rohrbaugh et al.

(10) Patent No.: US 6,741,946 B2
(45) Date of Patent: May 25, 2004

(54) SYSTEMS AND METHODS FOR FACILITATING AUTOMATED TEST EQUIPMENT FUNCTIONALITY WITHIN INTEGRATED CIRCUITS

(75) Inventors: John G. Rohrbaugh, Fort Collins, CO (US); Jeffrey R. Rearick, Fort Collins, CO (US); Shad R. Shepston, Firestone, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/383,323

(22) Filed: Mar. 7, 2003

(65) Prior Publication Data

US 2003/0158690 A1 Aug. 21, 2003

Related U.S. Application Data

(63) Continuation of application No. 09/649,797, filed on Aug. 29, 2000, now Pat. No. 6,556,938.

(51) Int. Cl.$^7$ ............................................. G01R 31/3187
(52) U.S. Cl. ........................ 702/117; 702/120; 702/124; 714/30; 714/733
(58) Field of Search ......................... 702/117–126, 64, 702/57–59, 65, 69, 75, 78, 79, 183, 185, 189, FOR 103–FOR 107, FOR 109, FOR 139, FOR 170, FOR 171; 324/527, 528, 537, 500, 531, 532, 759, 761, 765, 555, 73.1, 158.1; 365/201; 714/30, 25, 42, 718, 721, 724, 733, 734, 738

(56) References Cited

U.S. PATENT DOCUMENTS

| | | | | |
|---|---|---|---|---|
| 5,457,381 A | * | 10/1995 | Farwell | ................... 324/158.1 |
| 5,668,745 A | * | 9/1997 | Day | ........................... 702/121 |
| 5,682,392 A | | 10/1997 | Raymond et al. | ........... 714/727 |
| 5,796,260 A | | 8/1998 | Agan | ......................... 324/537 |
| 5,977,775 A | | 11/1999 | Chandler et al. | ............ 324/537 |
| 6,000,050 A | * | 12/1999 | Komoda et al. | .............. 714/724 |
| 6,275,962 B1 | | 8/2001 | Fuller et al. | ................. 714/724 |
| 6,324,485 B1 | | 11/2001 | Ellis | ........................... 702/117 |
| 6,365,859 B1 | | 4/2002 | Yi et al. | ...................... 209/573 |
| 6,396,279 B1 | | 5/2002 | Gruenert | ..................... 324/424 |
| 6,397,361 B1 | | 5/2002 | Saitoh | ........................ 714/724 |

OTHER PUBLICATIONS

Haulin, Tord, " Built–in Parametric Test for Controlled Impedance I/Os," Ericsson Telecom, S–126 25 Stockholm, Sweden, pp. 123–128, VLSI Test Symposium, 1997, 15 B IEEE, (no month).

Niggemeyer, M. Ruffer, " Parametric Built–In Self Test of VLSI Systems," Laboratory for Information Technology, University of Hannover, Germany, Design, Automation and Test in Europe Couteregie and Exhibition 1999, Proc 1999, p. 376–380.

* cited by examiner

Primary Examiner—Hal Wachsman

(57) ABSTRACT

A preferred system for facilitating automated test equipment functionality within integrated circuits includes automated test equipment (ATE) configured to electrically interconnect with an integrated circuit and to provide at least one signal to the integrated circuit. A first parametric test circuit, internal to the integrated circuit, also is provided. The first parametric test circuit is adapted to electrically communicate with the automated test equipment so that, in response to receiving a signal from the automated test equipment, the first parametric test circuit measures at least one parameter of a first pad of the integrated circuit.

30 Claims, 6 Drawing Sheets

SYSTEMS AND METHODS FOR FACILITATING AUTOMATED TEST EQUIPMENT FUNCTIONALITY WITHIN INTEGRATED CIRCUITS

CROSS-REFERENCE TO RELATED APPLICATION

This application is a continuation of U.S. utility application entitled, "Systems and Methods for Facilitating Automated Test Equipment Functionality Within Integrated Circuits," having Ser. No. 09/649,797, filed Aug. 29, 2000, now U.S. Pat. No. 6,556,938, which is entirely incorporated herein by reference.

BACKGROUND OF THE INVENTION

1. Field of the Invention

The present invention generally relates to integrated circuits and, in particular, to systems and methods for facilitating automated test equipment functionality within integrated circuits.

2. Description of the Related Art

Heretofore, integrated circuit (IC) devices have been tested and verified using a variety of test methods. For example, IC devices have been tested and verified to be defect free using functional test vectors, such as those applied to the IC by the use of automated test equipment (ATE), which stimulate and verify the IC device functionality at the pin-level of the device. A practical limitation to the utilization of ATE for testing IC's, however, is that the number of IC pins (or pads) that can be tested by a particular ATE has, heretofore, been limited by the physical configuration of the ATE. For instance, the number of pads of the IC to be tested may exceed the number of test channels provided by an ATE, or the number of pads may exceed the capacity of the ATE support hardware, such as by exceeding the maximum number of probes on a probe card, among others. As utilized herein, the term "pad" is used to refer collectively to both a physical site, which serves as an electrical contact for an IC, as well as circuitry associated with the physical site for enabling electrical communication between components of the IC and components external to the IC.

Additionally, performance limitations of an ATE may impose certain other testing restrictions. For example, the frequency of IC inputs and outputs may exceed the maximum frequency of the ATE, thereby limiting the test frequency of the IC to be tested to the maximum frequency of the ATE. Although configuring an ATE with additional test channels and/or a higher operating frequency may be accomplished, providing an ATE with an appropriately high pin count and/or an appropriately high operating frequency in order to eliminate the aforementioned deficiencies is, oftentimes, cost prohibitive.

In light of the foregoing and other deficiencies, it is known in the prior art to test IC devices utilizing a variety of "stop-gap" testing procedures, including: (1) connecting an ATE to less than all of the pins of an IC device; (2) connecting multiple pins of an IC device to a single ATE test channel; (3) testing the IC device in multiple passes of the ATE, with each pass testing a subset of the pins of the entire IC device; (4) testing the device at less than maximum frequency, and; (5) limiting, through design implementation, the pin count and/or frequency of the IC device to accommodate existing ATE, among others. As should be readily apparent, many of these "stop-gap" testing procedures may result in a loss of test coverage and, thereby, may lead to an increase in numbers of defective IC devices being shipped. Moreover, the practice of limiting, through design implementation, the pin count and/or frequency of the IC device to accommodate existing ATE is, oftentimes, an unacceptable constraint on IC design.

Therefore, there is a need for improved systems and methods which address these and other shortcomings of the prior art.

SUMMARY OF THE INVENTION

Briefly described, the present invention provides automated test equipment functionality within integrated circuits. In this regard, some embodiments of the present invention may be construed as providing integrated circuits (IC's). In a preferred embodiment, the integrated circuit includes a first pad electrically communicating with at least a portion of the IC, with the first pad being configured as a signal interface for components external to the IC. A first parametric test circuit also is provided, internal to the IC, and is adapted to measure at least one parameter of the first pad.

In an alternative embodiment, the integrated circuit includes first means for interfacing the IC with components external to the IC, and first means for measuring at least one parameter of the first means for interfacing.

Some embodiments of the present invention may be construed as providing systems for measuring a parameter of a pad of an IC. Preferably, the system includes automated test equipment (ATE) configured to electrically interconnect with the IC and to provide at least one signal to the IC. A first parametric test circuit, internal to the IC, also is provided. The first parametric test circuit is adapted to electrically communicate with the ATE so that, in response to receiving a signal from the ATE, the first parametric test circuit measures at least one parameter of the first pad.

Embodiments of the present invention also may be construed as providing methods for testing an IC. In a preferred embodiment, the IC includes a first pad configured as a signal interface for components external to the IC, and a first parametric test circuit, internal to the IC, and adapted to test at least one parameter of the IC. The method includes the steps of: electrically interconnecting ATE with the IC; providing at least one stimulus from the ATE to the IC so that the first parametric test circuit measures at least one parameter of the first pad; and receiving information corresponding to the at least one parameter measured by the first parametric test circuit.

In an alternative embodiment, a method for forming an integrated circuit includes the steps of providing a first pad configured as a signal interface for components external to the IC and providing a first parametric test circuit internal to the IC that is adapted to measure at least one parameter of the first pad.

Additionally, some embodiments of the present invention may be construed as providing computer readable media. In a preferred embodiment, the computer readable medium includes a computer program for facilitating testing of an IC and incorporates logic configured to enable ATE to provide at least one signal to the IC so that a first parametric test circuit of the IC measures at least one parameter of a first pad of the IC. Logic configured to enable the ATE to receive, from the first parametric test circuit, data corresponding to the at least one parameter of the first pad also is provided.

Other features and advantages of the present invention will become apparent to one with skill in the art upon

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION OF THE PREFERRED EMBODIMENTS

Figure 1:
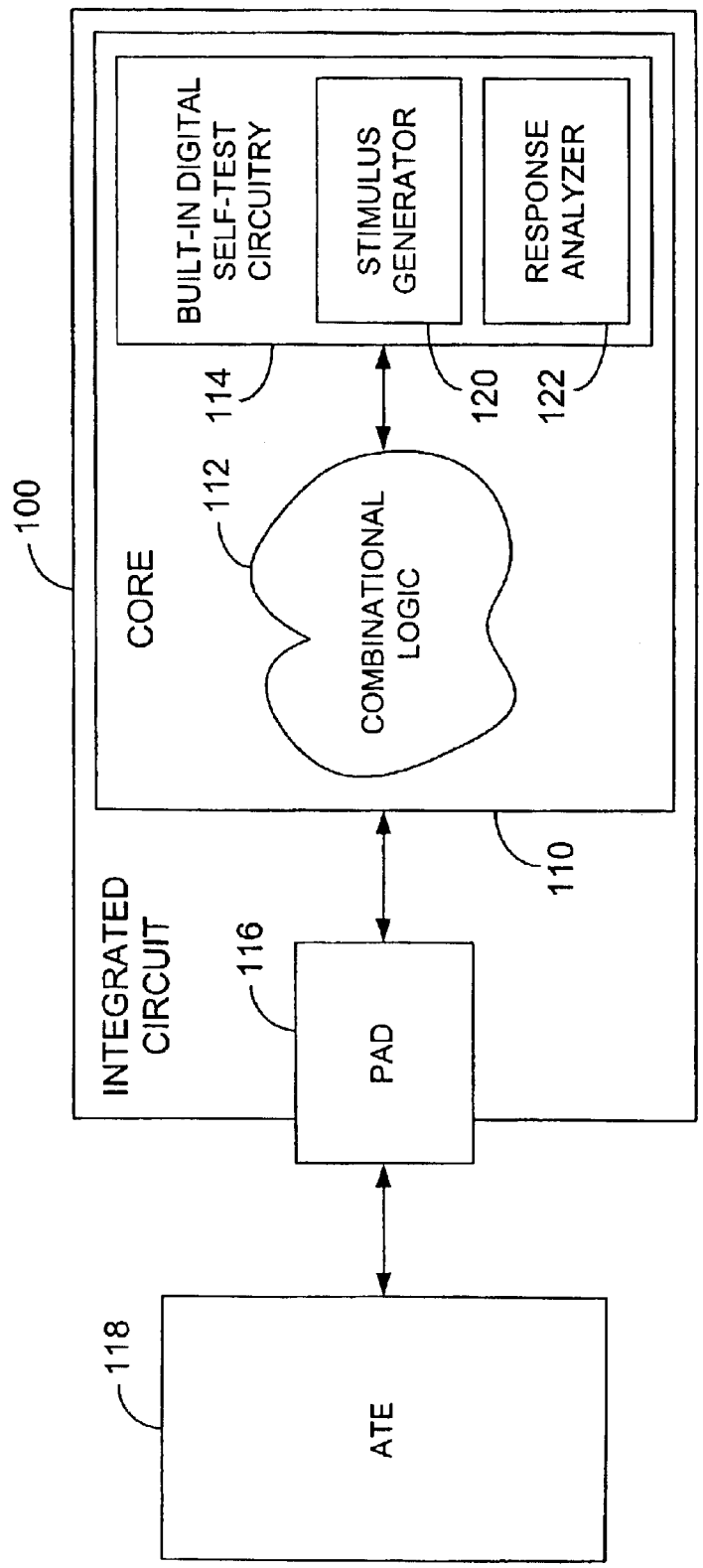
FIG. 1 is a schematic diagram depicting a representative integrated circuit incorporating digital self-test circuitry of the prior art.

Reference will now be made in detail to the description of the invention as illustrated in the drawings with like numerals indicating like parts throughout the several views. As mentioned briefly hereinbefore, it is known to incorporate built-in (digital) self test circuitry into an integrated circuit. Referring now to FIG. 1, a representative integrated circuit 100 incorporating such built-in self-test circuitry will be described in greater detail.

As shown in FIG. 1, integrated circuit 100 includes a core 110 which incorporates combinational logic 112 and digital self-test circuitry 114. Core 110 electrically communicates with pad 116 which is configured to electrically communicate with devices external to the integrated circuit, such as an automated test equipment (ATE) 118, for example. So configured, signals provided from an external device, e.g., ATE 118, may be delivered to the core 110 via a transmission path which includes pad 116.

As is known, digital self-test circuitry 114 is configured to provide functional-based digital testing of logic circuitry contained within core 110. In order to accomplish such testing, digital self-test circuitry 114 typically incorporates a stimulus generator 120 and a response analyzer 122. More specifically, stimulus generator 120 is configured to provide one or more test patterns for testing logic circuitry of the core. The pattern or patterns provided to the logic circuitry is comprised of digital data, i.e., zeros and ones. In response to the various patterns, the logic circuitry under test then provides a response signal or signals to the response analyzer 122 which is able to interpret the response and provide a test result signal, which may be provided externally of the integrated circuit. Thus, the digital self-test circuitry provides for digital, functional testing of the core by applying digital test patterns to the logic circuitry of the core and has, heretofore, substantially removed the need for external test equipment, i.e., ATE 118, to generate and provide digital patterns to the integrated circuit for facilitating testing of the logic circuitry.

Figure 2:
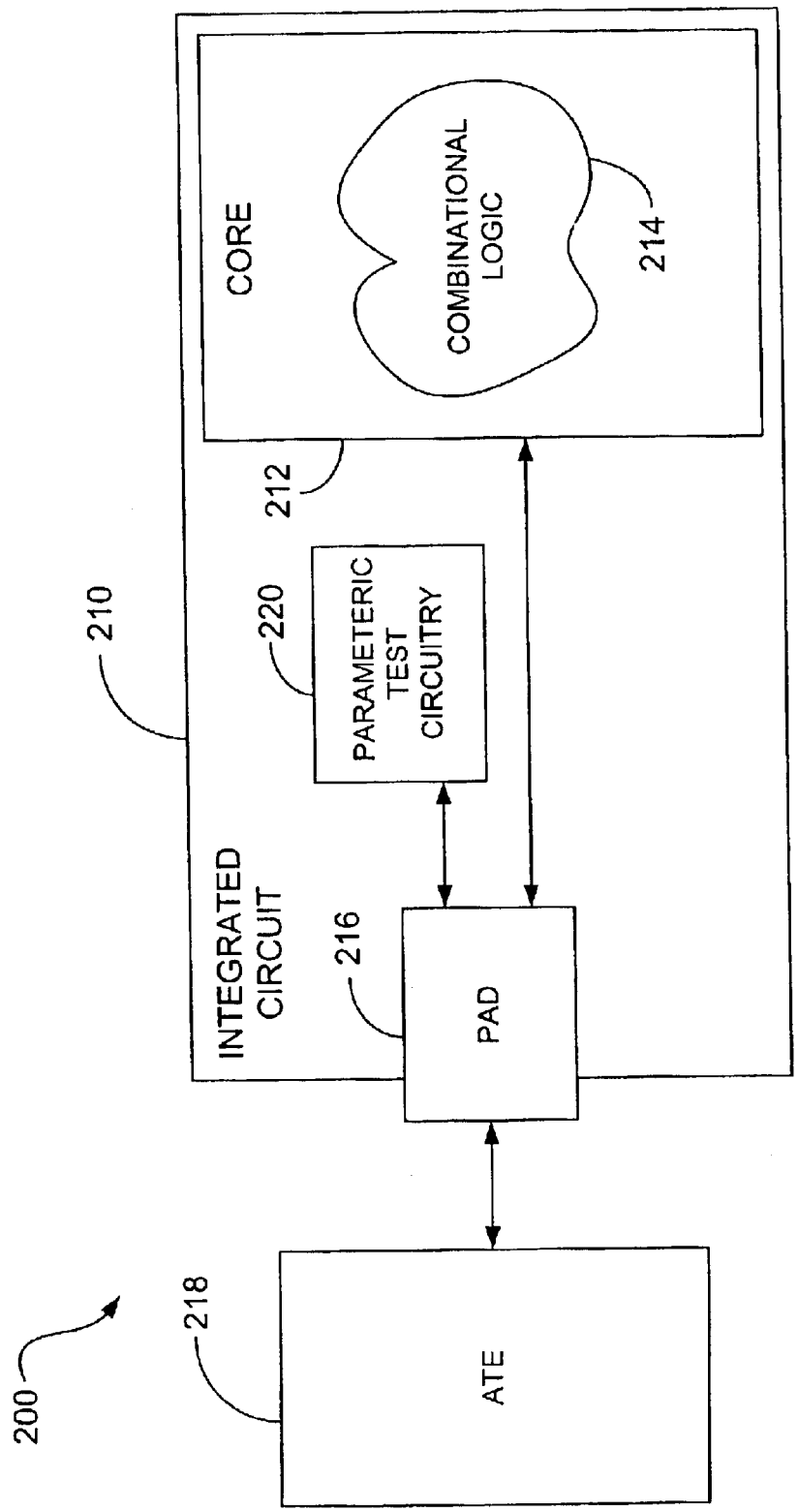
FIG. 2 is a schematic diagram depicting a preferred embodiment of the present invention.

General characteristics of a preferred embodiment of the analog parameter test system 200 of the present invention will now be described in reference to the high-level schematic diagram of FIG. 2. As depicted in FIG. 2, system 200 incorporates an integrated circuit 210 which includes a core 212. Core 212 incorporates combinational logic 214 and electrically communicates with a pad 216, which is configured to allow intercommunication of the combinational logic with devices, such as ATE 218, for example, external to the integrated circuit. Additionally, integrated circuit 210 also incorporates parametric test circuitry 220 which electrically communicates, either directly or indirectly, with pad 216. As described in detail hereinafter, parametric test circuitry 220 is configured to provide selected ATE functionality and, thereby, reduces the necessity for specialized automated test equipment for testing integrated circuits of various configurations. It should be noted that, although parametric test circuitry 220 is depicted in FIG. 2 as residing outside core 212, various other arrangements of test circuitry 220 may be utilized, such as arranging the test circuitry within the core, for instance. Additionally, the test circuitry may be configured to communicate with the ATE via a pad other than the pad to be tested, i.e., a pad other than pad 216.

As mentioned hereinbefore, ATE typically provides the ability to test a wide variety of integrated circuits. However, oftentimes, the full testing capability of a given ATE is usually not required to test a specific type of integrated circuit. Additionally, oftentimes, the number of pads of an integrated circuit may exceed the number of test channels of a given ATE, thereby necessitating the use of an ATE with an increased number of tester channels or necessitating the use of less than optimal testing procedures, e.g., testing fewer than all of the pads of an integrated circuit simultaneously, for instance.

By providing parametric test circuitry "on-chip," the testing of integrated circuits, such as integrated circuit 210, may be implemented utilizing conventional ATE, whereby test capability not typically provided by the conventional ATE may be provided by the parametric test circuitry. For example, and not by means of limitation, the following test capability may be provided by the parametric test circuitry, including: the ability to measure time, voltage, current, resistance, capacitance, inductance, frequency and/or jitter; the ability to measure, at specified times, voltage, current, resistance, capacitance, inductance, frequency and/or jitter; the ability to provide data; the ability to drive data at specified times; the ability to receive data; the ability to receive data at specified times; the ability to provide reference voltage; the ability to sink or source current; the ability to provide high impedance; and the ability to calibrate in relation to ATE, among others. So provided, the parametric test circuitry has the ability to provide testing capability that a given ATE does not provide, or is not able to provide, while utilizing various capabilities that a given ATE does provide. Thus, the testing system 200 of the present invention may provide an efficient and effective testing system which draws from at least some of the inherent strengths of conventional ATE, e.g., reduced costs, while providing potentially improved testing performance.

By utilizing the parametric test circuitry of the present invention, testable pin count of an integrated circuit is not necessarily limited by the ATE, such as by the tester channel configuration of a given ATE. For instance, the ATE may provide signals, such as scan test signals and resets, for example, to some pads of an integrated circuit under test, while leaving other pads to be tested by the parametric test circuitry. Additionally, utilization of the parametric test circuitry makes it possible to test the integrated circuits at frequencies greater than the test frequency of the ATE.

As described hereinbefore, the present invention is adapted to facilitate automated test equipment functionality for testing integrated circuits. In this regard, some embodiments of the present invention may be construed as providing test systems for testing integrated circuits, with such systems being implemented in hardware, software, firmware, or a combination thereof. In a preferred embodiment, however, the test system is implemented as a software package, which can be adaptable to run on different platforms and operating systems as shall be described further herein. In particular, a preferred embodiment of the test system, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 3:
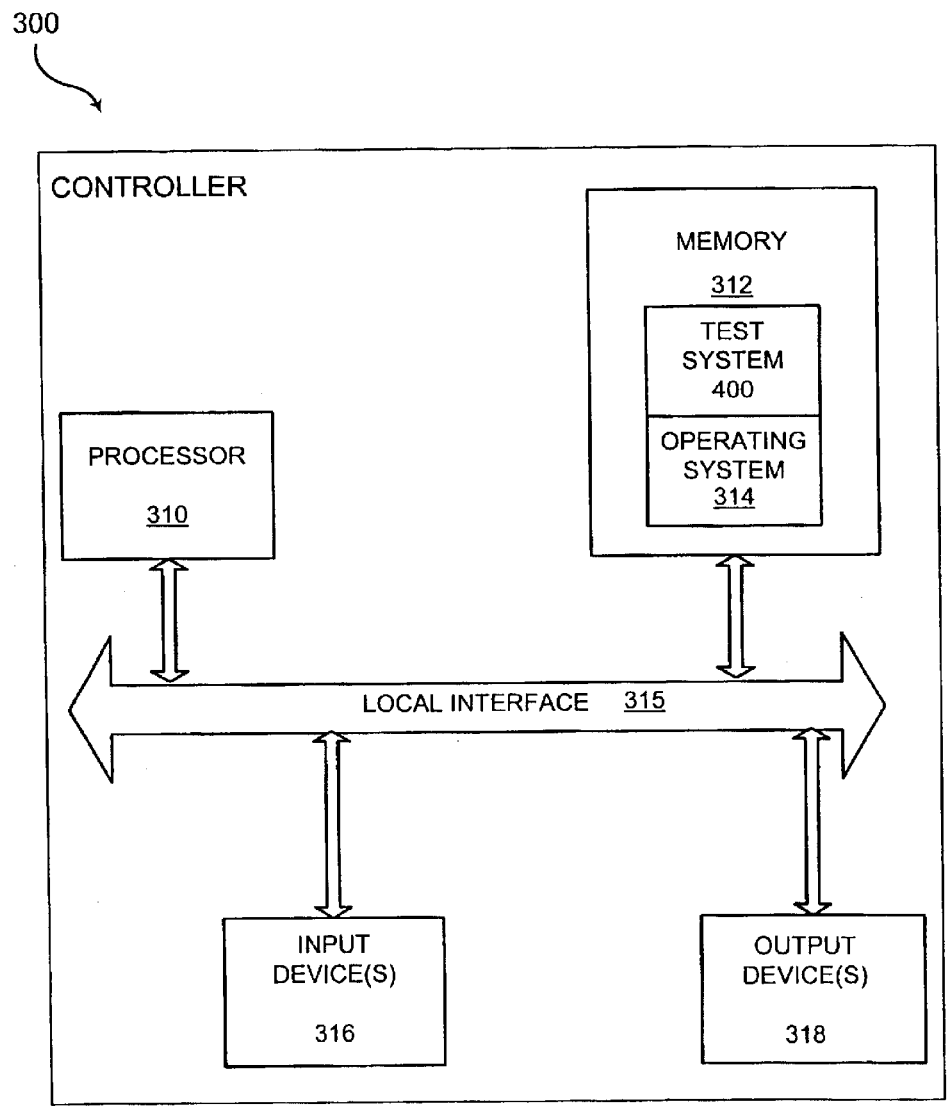
FIG. 3 is a schematic diagram depicting a representative processor-based system which may be utilized as a controller of the present invention.

FIG. 3 illustrates a typical computer or processor-based system 300 which may facilitate control functionality (described in detail hereinafter) of the test system 400 of the present invention. As shown in FIG. 3, a computer system 300 generally comprises a processor 302 and a memory 304 with an operating system 306. Herein, the memory 304 may be any combination of volatile and nonvolatile memory elements, such as random access memory or read only memory. The processor 302 accepts instructions and data from memory 304 over a local interface 308, such as a bus(es). The system also includes an input device(s) 310 and an output device(s) 312. Examples of input devices may include, but are not limited to, a serial port, a scanner, or a local access network connection. Examples of output devices may include, but are not limited to, a video display, a Universal Serial Bus, or a printer port. Generally, this system may run any of a number of different platforms and operating systems, including, but not limited to, HP-UX™, LINUXT™, UNIX™, SUN SOLARIS™ or Windows NT™ operating systems. The test system 400 of the present invention, the functions of which shall be described hereinafter, resides in memory 304 end is executed by the processor 302.

Figure 4:
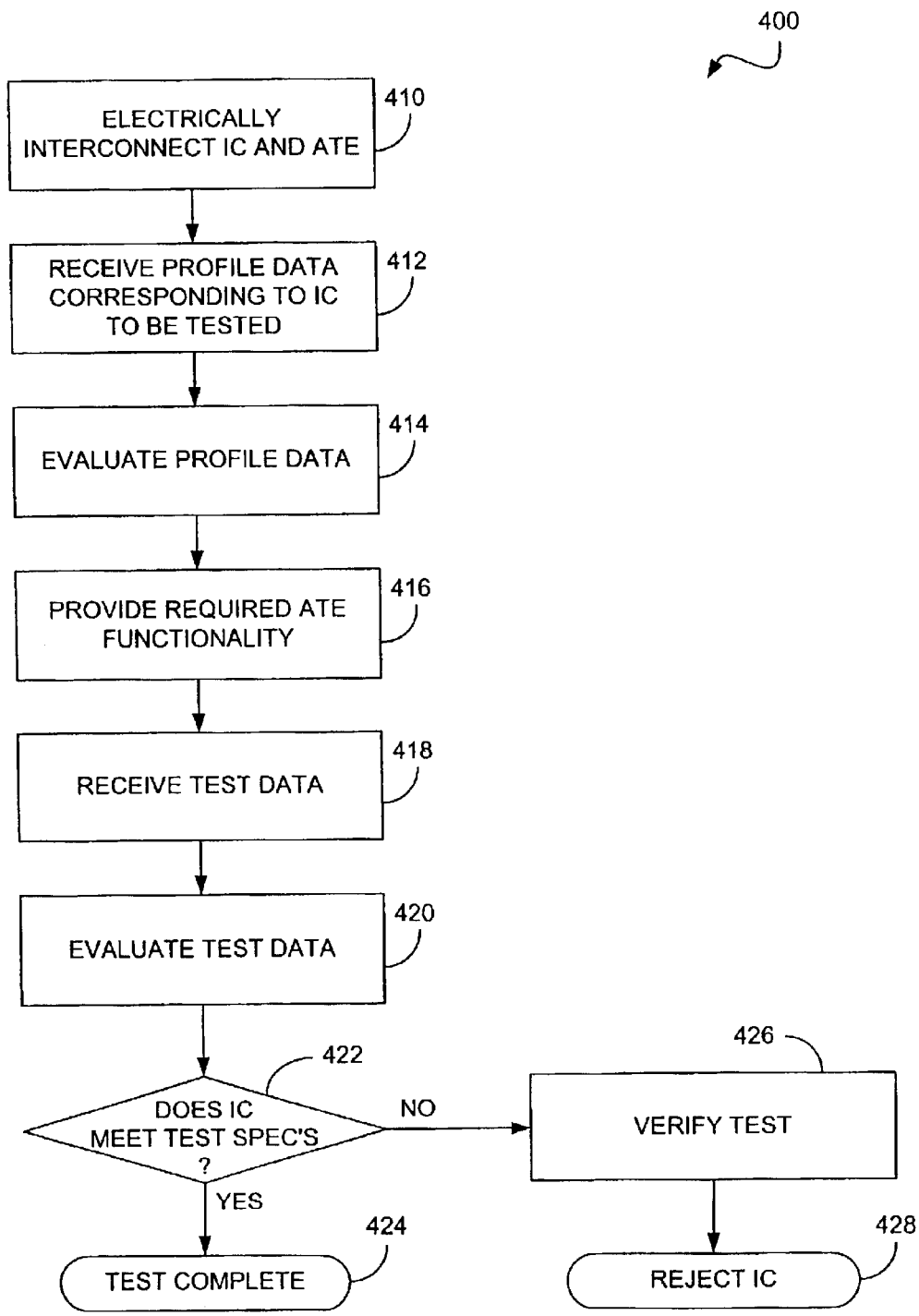
FIG. 4 is a flowchart depicting the functionality of a preferred embodiment of the present invention.

The flowchart of FIG. 4 shows the functionality and operation of a preferred implementation of the test system 400 depicted in FIG. 3. In this regard, each block of the flowchart represents a module segment or portion of code which comprises one or more executable instructions for implementing the specified logical function or functions. It should also be noted that in some alternative implementations the functions noted in the various blocks may occur out of the order depicted in FIG. 4. For example, two blocks shown in succession in FIG. 4 may, in fact, be executed substantially concurrently where the blocks may sometimes be executed in the reverse order depending upon the functionality involved.

As depicted in FIG. 4, test system or method 400 preferably begins at block 410 where an IC to be tested is electrically interconnected with an ATE. Proceeding to block 412, profile data corresponding to the IC to be tested is received. Such profile data may include, but is not limited to, information relating to the type of IC, the type(s) of analog test circuitry, the type of test(s) to be conducted, and/or electrical continuity information corresponding to the interconnection of the ATE and the IC, among others. The profile data may be provided in numerous manners, such as by being provided in the form of an operator input at a work station or as a response to a test initiation signal delivered to the analog test circuitry by the ATE, for instance. After receiving the profile data, the process preferably proceeds to block 414 where the data is evaluated, i.e., a determination is made as to whether testing may proceed.

The process then proceeds to block 416 where the IC under test is provided, by the ATE, with appropriate signals to facilitate testing, such as analog parameter testing, among others. Such signals may include, but are not limited to: one or more power signals; one or more clock signals; one or more reset signals; one or more critical signals, and; one or more test control signals, among others. At block 418, test data is received, such as by the ATE, with the data being received in any suitable manner, e.g., intermittently throughout the testing cycle, or after testing has been completed. At block 420, analog test parameters may be evaluated to determine whether the integrated circuit is functioning as desired. If it is determined that the integrated circuit is not functioning as desired, the process may proceed to block 426 where the test results may be verified, such as by repeating at least some of the aforementioned process steps 410–422, and if the determination once again is made that the integrated circuit is not functioning as desired, the process may proceed to block 428 where the integrated circuit may be rejected. If, however, it is determined that the integrated circuit is functioning as desired, the process may proceed to block 424 where the process may terminate.

Figure 5:
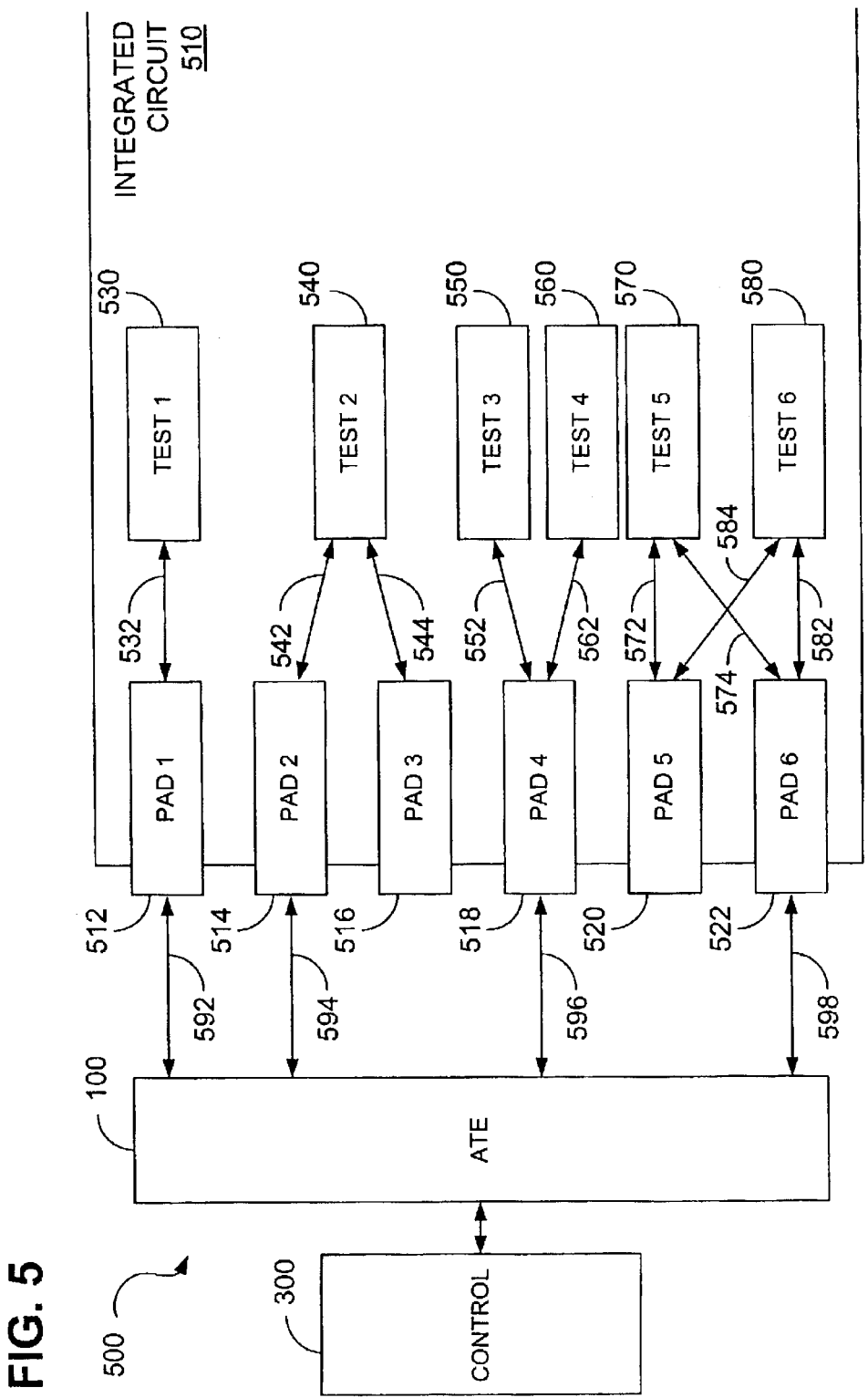
FIG. 5 is a schematic diagram depicting a preferred embodiment of the present invention.

Referring now to FIG. 5, various aspects of the present invention, including parametric test circuitry implementation and calibration will now be described in greater detail. As shown in FIG. 5, a preferred embodiment 500 of the present invention incorporates an integrated circuit 510 which includes multiple pads. In particular, integrated circuit 510 includes pads 1 through 6 (512, 514, 516, 518, 520 and 522 respectively). As depicted in FIG. 5, the integrated circuit also incorporates various parametric test circuitry, such as Test 1 (530), Test 2 (540), Test 3 (550), Test 4 (560), Test 5 (570) and Test 6 (580). The various parametric test circuitry electrically communicate with their respective pads in a variety of configurations. For instance, circuitry 530 communicates directly with pad 512 via transmission path 532; is circuitry 540 communicates with each of pads 514 and 516 by utilizing transmission paths 542 and 544 respectively; circuitry 550 and circuitry 560 each electrically communicate with pad 518 via transmission paths 552 and 562 respectively; circuitry 570 communicates with pads 520 and 522 via transmission path 572 and 574 respectively; and circuitry 580 also communicates with pads 520 and 522, albeit, via transmission path 582 and 584 respectively. Thus, an integrated circuit may incorporate various configurations of intercommunication between the various pads and various circuitry, as well as various pad types and various parametric test circuitry types.

As an illustrative example, and not for the purpose of limitation, an integrated circuit may be configured to utilize one parametric test circuit to test multiple pads, e.g., utilizing one parametric test circuit to test multiple pads of like type. Such a configuration is represented schematically in FIG. 5 by Pad 2 and Pad 3, which are both tested by Test 2.

As shown in FIG. 5, ATE 502 electrically communicates with the test circuitry of integrated circuit 510 by utilizing a variety of transmission path configurations. For example, circuitry 530 communicates with the ATE via transmission path 532, pad 512 and transmission path 592; circuitry 540 communicates with the ATE via transmission path 542, pad 514 and transmission path 594; circuitry 550 communicates with the ATE via transmission path 552, pad 518 and transmission path 596; circuitry 560 communicates with the ATE via transmission path 562, pad 518 and transmission path 596; circuitry 570 communicates with the ATE via transmission path 574, pad 522 and transmission path 598; and circuitry 580 communicates with the ATE via transmission path 582, pad 522 and transmission path 598.

As is known, when ATE is used to test an integrated circuit, the ATE should is be calibrated to ensure that it is providing accurate measurements. As the present invention provides at least selected ATE functionality, calibration of the parametric test circuitry also should be performed. Typical prior art solutions for addressing the issues of calibration have included: designing test circuitry to be self-calibrating; designing test circuitry to be invariant to process, voltage, and temperature (PVT); and not calibrating the test circuitry at all. In regard to self-calibrating test circuitry, such a technique potentially causes the disadvantage of increasing the size of the test circuitry to a size where use of such circuitry within an integrated circuit is no longer practical. In regard to designing the test circuitry to be invariant to PVT, providing such invariance is effectively not possible. For instance, heretofore, a typical solution has been to make any PVT variance easily characterizable and predictable. Additionally, this technique also may cause the size of the circuitry to increase to a point where its use is no longer practical. In regard to deliberately failing to calibrate test circuitry, obviously, such a technique may result in test circuitry producing inaccurate results which may lead to an increase in the number of improperly functioning integrated circuits being shipped or may cause an increase in the number of properly functioning integrated circuits which are rejected from being shipped.

Figure 6:
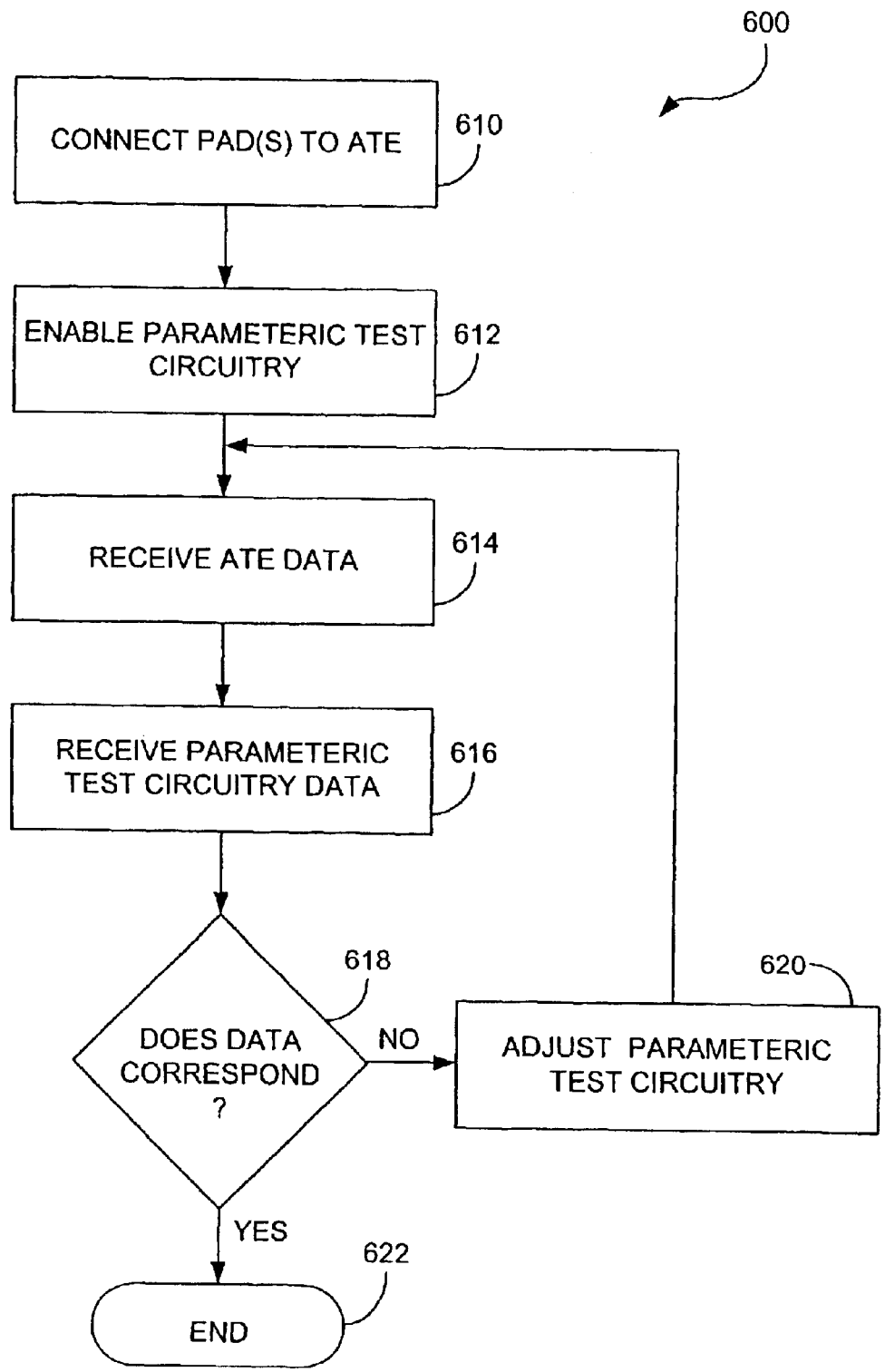
FIG. 6 is a flowchart depicting the functionality of a preferred embodiment of the present invention during calibration.

Since, it is preferable to calibrate the parametric test circuitry of the present invention, the following preferred calibration method is provided for the purpose of illustration, and not for the purpose of limitation. As shown in FIG. 6, a preferred method 600 for calibrating parametric test circuitry of the present invention preferably begins at block 610 where designated pads of an integrated circuit to be tested are connected to ATE. Preferably, when a circuit design, e.g., a pad, is used multiple times within an IC, identical parametric test circuitry is associated with each instance of that circuit design. When so configured, connecting of the pads to the ATE, such as depicted in block 610, preferably includes merely connecting the ATE to one or more instances of the circuit design. Since different instances of the repeated circuit design are assumed to be identical in their defect-free electrical behavior, measurements made on the ATE-connected instance of the circuit design may be assumed to correlate to the measurements made at other instances of that circuit design. It should be noted, however, that since each identical instance of the block is assumed to have identical defect-free electrical behavior, only one non-connective pad of each pad type need be utilized, although additional ones of the pads may be utilized for added error detection and comparison.

Proceeding to block 612, parametric test circuitry is enabled. With both ATE and the appropriate parametric test circuitry now enabled, measurements such as driver strength ($I_{OH}$, $I_{OL}$), tri-state leakage, receiver trip level ($V_{IH}$, $V_{IL}$), receiver set-up and hold times, driver rise and fall times, driver clock-to-Q time, $V_{OH}$, and $V_{OL}$, for example, may be measured by either or both of the ATE and the parametric test circuitry. Thus, as depicted in blocks 614 and 616, the process includes the steps of receiving ATE measurements and receiving parametric test circuitry measurements, respectively. At block 618, a determination may be made as to whether the ATE measurement data and the parametric test circuitry data appropriately correspond, thereby indicating proper calibration of the parametric test circuitry. If, however, it is determined that the measurements do not correspond, the process may proceed to block 620 where the parametric test circuitry measurements may be adjusted to match those measurements obtained from the ATE. Thereafter, the process may proceed back to block 614 and proceed as described hereinbefore until the parametric test circuitry measurements are appropriately calibrated. Once appropriate calibration has been achieved, the process may end, such as depicted in block 622.

The foregoing description has been presented for purposes of illustration and description. It is not intended to be exhaustive or to limit the invention to the precise forms disclosed. Obvious modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A method for testing an integrated circuit (IC), the IC having a first pad and a first parametric test circuit, the first pad being configured as a signal interface for components external to the IC, the first parametric test circuit being internal to the IC and being adapted to test at least one parameter of the IC, said method comprising the steps of:

electrically interconnecting automated test equipment (ATE) with the IC such that the first pad is not directly electrically connected to the ATE;

providing at least one stimulus from the ATE to the IC such that the first parametric test circuit measures at least one parameter of the first pad; and receiving information corresponding to the at least one parameter measured by the first parametric test circuit.

2. The method of claim 1, wherein the at least one parameter is selected from the group consisting of: voltage, current, resistance, capacitance, inductance, frequency, jitter, and time.

3. The method of claim 1, wherein the IC has a second pad, and wherein the step of providing at least one stimulus comprises the step of providing at least one stimulus from the ATE to the IC such that the first parametric test circuit measures at least one parameter of each of the first pad and the second pad.

4. The method of claim 1, wherein the ATE has a first operating frequency and the IC has a plurality of pads and a plurality of parametric test circuits, and wherein the step of providing at least one stimulus comprises the step of measuring, by the plurality of parametric test circuits, parameters of the plurality of pads at a frequency higher than the first operating frequency of the ATE.

5. The method of claim 1, wherein the IC has built-in self test equipment internal thereto, the built-in self test equipment being adapted to test digital functionality of at least a portion of the IC, and wherein the step of providing at least one stimulus comprises the step of providing at least one stimulus from the ATE to the built-in test equipment such that the built-in self test equipment tests the digital functionality of at least a portion of the IC.

6. The method of claim 1, wherein the IC has a second parametric test circuit, and wherein the step of providing at least one stimulus comprises the step of providing at least one stimulus from the ATE to the IC such that each of the first parametric test circuit and the second parametric test circuit measures at least one parameter of the first pad.

7. The method of claim 1, wherein the IC has a plurality of pads, and wherein the step of providing at least one stimulus comprises the step of providing at least one stimulus from the ATE to a subset of the plurality of pads.

8. The method of claim 1, wherein the IC has a plurality of pads, and wherein the step of electrically interconnecting comprises the step of electrically interconnecting the ATE to a subset of the plurality of pads.

9. The method of claim 1, wherein the step of providing at least one stimulus comprises the steps of:

measuring a first parameter of the first pad by the ATE; and measuring the first parameter of the first pad by the first parametric test circuit.

10. The method of claim 9, further comprising the steps of:

receiving information corresponding to the first parameter measured by the ATE;

receiving information corresponding to the first parameter measured by the first parametric test circuit; and comparing the information corresponding to the first parameter measured by the ATE to the information corresponding to the first parameter measured by the first parametric test circuit.

11. The method of claim 10, wherein the step of comparing comprises the steps of:

comparing the information corresponding to the first parameter measured by the ATE to the information corresponding to the first parameter measured by the first parametric test circuit to determine whether the IC is properly calibrated; and calibrating the IC such that a difference between the information corresponding to the first parameter measured by the ATE and the information corresponding to the first parameter measured by the first parametric test circuit is reduced.

12. A method for forming an integrated circuit (IC) comprising the steps of:

providing a first pad configured as a signal interface for components external to the IC; and providing a first parametric test circuit internal to the IC, the first parametric test circuit being adapted to measure at least one parameter of the first pad despite the first pad not being directly electrically connected to automated test equipment (ATE);

wherein the step of providing a first parametric test circuit comprises the step of providing a first parametric test circuit configured to respond to at least one signal delivered from the ATE such that, in response to the at least one signal, the first parametric test circuit measures the at least one parameter of the first pad.

13. The method of claim 12, wherein the at least one parameter is selected from the group consisting of: voltage, current, resistance, capacitance, inductance, frequency, jitter, and time.

14. The method of claim 12, further comprising the step of providing built-in self test equipment electrically communicating with at least a portion of the IC, the built-in self test equipment being internal to the IC and being adapted to test digital functionality of at least a portion of the IC.

15. A method for forming an integrated circuit (IC) comprising the steps of:

providing a first pad configured as a signal interface for components external to the IC;

providing a first parametric test circuit internal to the IC, the first parametric test circuit being adapted to measure at least one parameter of the first pad despite the first pad not being directly electrically connected to automated test equipment (ATE); and providing a second pad configured as a signal interface for components external to the IC, and wherein the step of providing a first parametric test circuit comprises the step of providing a first parametric test circuit configured to respond to at least one signal delivered from automated test equipment (ATE) such that, in response to the at least one signal, the first parametric test circuit measures at least one parameter of each of the first pad and the second pad.

16. The method of claim 15, wherein the at least one parameter is selected from the group consisting of: voltage, current, resistance, capacitance, inductance, frequency, jitter, and time.

17. The method of claim 15, further comprising the step of providing built-in self test equipment electrically communicating with at least a portion of the IC, the built-in self test equipment being internal to the IC and being adapted to test digital functionality of at least a portion of the IC.

18. A method for forming an integrated circuit (IC) comprising the steps of:

providing a first pad configured as a signal interface for components external to the IC;

providing a first parametric test circuit internal to the IC, the first parametric test circuit being adapted to measure at least one parameter of the first pad despite the first pad not being directly electrically connected to automated test equipment (ATE); and providing a second parametric test circuit internal to the IC and adapted to measure at least one parameter of the first pad, the first and second parametric test circuits each being configured to respond to at least one signal delivered from automated test equipment (ATE) such that, in response to the at least one signal, each of the first parametric test circuit and the second parametric test circuit measures at least one parameter of the first pad.

19. The method of claim 18, wherein the at least one parameter is selected from the group consisting of: voltage, current, resistance, capacitance, inductance, frequency, jitter, and time.

20. The method of claim 18, further comprising the step of providing built-in self test equipment electrically communicating with at least a portion of the IC, the built-in self test equipment being internal to the IC and being adapted to test digital functionality of at least a portion of the IC.

21. An integrated circuit (IC) comprising:
a first pad electrically communicating with at least a portion of the IC, said first pad being configured as a signal interface for components external to said IC; and
a first parametric test circuit internal to said IC and being adapted to measure at least one parameter of said first pad despite the first pad not being directly electrically connected to automated test equipment;
wherein said first parametric test circuit is configured to receive at least one stimulus from automated test equipment (ATE) such that said first parametric test circuit measures said at least one parameter of said first pad.

22. The IC of claim 21, wherein said at least one parameter is selected from the group consisting of: voltage, current, resistance, capacitance, inductance, frequency, jitter, and time.

23. The IC of claim 21, further comprising:
built-in self test equipment internal to said IC and being adapted to test digital functionality of at least a portion of said IC.

24. The IC of claim 21, further comprising a second pad electrically communicating with at least a portion of said IC, said second pad being configured as a signal interface for components external to said IC, and wherein said first parametric test circuit is configured to measure at least one parameter of each of said first pad and said second pad.

25. The IC of claim 21, further comprising a second parametric test circuit internal to said IC and being adapted to measure at least one parameter of said first pad.

26. The IC of claim 21, wherein said at least one parameter of said first pad is measured relative to a reference external to said IC.

27. The IC of claim 21, wherein said at least one parameter of said first pad is measured relative to a reference internal to said IC.

28. The IC of claim 21, wherein said at least one parameter of said first pad is measured relative to a reference having an undefined absolute value.

29. The IC of claim 21, wherein said at least one parameter of said first pad is measured relative to a reference having a defined absolute value.

30. The IC of claim 21, wherein the ATE has a first operating frequency, and wherein said first parametric test circuit is configured to measure, in response to receiving the at least one stimulus from the ATE, said at least one parameter of said first pad at a frequency higher than the first operating frequency of the ATE.

* * * * *